United States Patent
Kim et al.

(10) Patent No.: US 6,878,261 B2
(45) Date of Patent: Apr. 12, 2005

(54) SURFACE TREATMENT METHOD OF COPPER FOIL WITH SILANE COUPLING AGENT

(75) Inventors: Sang-Kyum Kim, Kyunggi-do (KR); Chang-Hee Choi, Seoul (KR); Byoung-Un Kang, Kyunggi-do (KR)

(73) Assignee: LG Cable Ltd. (KR)

( * ) Notice: Subject to any disclaimer, the term of this patent is extended or adjusted under 35 U.S.C. 154(b) by 224 days.

(21) Appl. No.: 10/278,644

(22) Filed: Oct. 23, 2002

(65) Prior Publication Data

US 2003/0111351 A1 Jun. 19, 2003

(30) Foreign Application Priority Data

Oct. 23, 2001 (KR) .................. 10-2001-0065236

(51) Int. Cl.[7] .................. C23C 28/00; C23C 8/00; C25D 5/44
(52) U.S. Cl. .................. 205/215; 205/194; 148/240
(58) Field of Search .................. 205/194, 215; 148/240

(56) References Cited

U.S. PATENT DOCUMENTS 3,293,109 A    12/1966  Luce et al.
4,469,567 A  * 9/1984  Torday et al. .................. 205/50

FOREIGN PATENT DOCUMENTS

| JP | 549-108808 | 3/1976 |
|---|---|---|
| JP | 5-171458 | 7/1993 |
| KR | 101980000492 | 11/1983 |
| KR | 1019810001120 | 10/1984 |
| KR | 1019840006731 | 4/1987 |

* cited by examiner

Primary Examiner—Edna Wong
(74) Attorney, Agent, or Firm—Cantor Colburn LLP

(57) ABSTRACT

A surface treatment method for increasing adhesion of a surface of copper foil to an insulating epoxy-impregnated substrate used in printed circuit boards is provided. The method includes nodularizing a surface of an electrolytic copper foil, surface-treating the surface of the nodularized electrolytic copper foil by Zn—As alloy electrodeposition to form a Zn—As composite layer thereon, and coating the surface of the surface-treated electrolytic copper foil with a silane coupling agent mixture, whose compounding ratio of 3-aminopropyltriethoxysilane with respect to vinyltriethoxysilane is between 6:4 and 9:1. This method is very effective to prevent discoloration of copper foil caused by oxidation and the like.

6 Claims, 2 Drawing Sheets

SURFACE TREATMENT METHOD OF COPPER FOIL WITH SILANE COUPLING AGENT

BACKGROUND OF THE INVENTION

1. Field of the Invention

This invention relates to a surface treatment method of a copper foil with a silane coupling agent. More particularly, this invention relates to a surface treatment method of a copper foil including coating the surface of the copper foil with a mixture of 3-aminopropyltriethoxy silane and vinyl-triethoxysilane to increase adhesion of the surface of the copper foil to an insulating substrate.

2. Description of the Related Art

It is common that inorganic materials such as metal are bonded with organic materials such as rubber and resin as seen in printed circuit boards (PCBs). PCB is fabricated by adhering a copper foil to a substrate with mechanical and chemical process to make insulating resin-impregnated substrate with necessary patterns.

Printed circuits are widely used in various industrial electronic/electric devices such as communication equipments and all sorts of control devices in addition to various household appliances, such as radios, televisions, washing machines, audios, microwave oven and VTR. In early stage, single side PCB was conventionally used, but nowadays multi-layer PCB, double side PCB and the like are additionally used.

In recent years, as the electronic/electric devices are more and more slim and compact, the PCBs are required to be finer, smaller and more concentrated than ever. Hence, the high quality electrolytic copper foil is needed in manufacturing of substrates and printed circuits. The insulating substrates usually used for the industrial printed circuits are prepreg made of epoxy resin in which glass fiber is impregnated. In general, the PCB is obtained by the process comprising bonding a electrolytic copper foil used for printed circuit to a insulating substrate under the high temperature and high pressure and then etching the copper foil according to the circuit design.

As the copper foil-bonded substrates go through a few of hot pressing and heat treatment process, the adhesion of copper foil to resin may be deteriorated due to heat shock, rust or stain which may occur during mechanical and chemical process and undercutting phenomenon caused by etching. Hence, the adhesion of copper foil to the insulating substrate may be degraded. Therefore, a number of the method of coating the metal surface by another kind of metal for improving adhesion are suggested.

For example, U.S. Pat. No. 3,293,109 discloses a surface treatment method for increasing mechanical adhesion of copper foil by forming copper nodules on a surface of the copper foil and then coating the nodularized-surface. Korean patent publication No. 83-2611 discloses a method of forming zinc layer containing tin and vanadium on copper foil. Korean patent publication No. 84-1643 discloses a method of forming phosphorous nickel layer on copper foil. Korean patent publication No. 87-692 discloses a method of forming nickel layer containing sulfur, phosphorus and arsenic on copper foil. Japanese patent publication S51-35711 discloses a method of conducting rust-preventing treatment using electrolytic chromate after barrier surface treatment on the surface of copper. But all of above-mentioned processes are proposed to improve adhesion of copper foil layer to insulation substrate with mechanical method. Therefore, these processes are not the efficient methods to inhibit copper ions' diffusion towards resin layer during heat process and weak adhesion caused by alloying element effect during chemical treatment.

Furthermore, these processes have limitations in the matter of improving adhesion of metal as inorganic material to polymer as organic material.

SUMMARY OF THE INVENTION

The present invention is designed to solve the problems of the prior art, and therefore an object of the present invention is to provide a surface treatment method for increasing adhesion of a copper foil to a PCB.

In order to accomplish the above object, the present invention provides a surface treatment method for increasing adhesion of a copper foil to an insulating substrate, which includes the steps of: (a) nodularizing a surface of an electrolytic copper foil, (b) treating the surface of the nodularized electrolytic copper foil by Zn—As alloy electrodeposition to form a Zn—As composite layer thereon and (c) coating the surface of the surface-treated electrolytic copper foil by a silane coupling agent containing 3-aminopropyltriethoxysilane and vinyltriethoxysilane.

It is preferable that the silane coupling agent is a mixture containing 60~90 wt % of 3-aminopropyltriethoxysilane and 40~10 wt % of vinyltriethoxysilane.

Preferably, the step (a) includes the step of forming nodules on the surface of electrolytic copper foil to increase surface area.

It is also preferable that the Zn—As electrolyte includes zinc sulfate, arsenious acid and pyrophosphoric acid.

Also, the step (b) is preferably carried out for about 5 seconds at current density $10A/dm^2$ under the condition of temperature 40° C. and pH 11 of the Zn—As electrolyte.

BRIEF DESCRIPTION OF THE DRAWINGS

These and other features, aspects, and advantages of the present invention will become better understood with regard to the following description, appended claims, and accompanying drawings, in which like components are referred to by like reference numerals. In the drawings:

DETAILED DESCRIPTION OF THE PREFERRED EMBODIMENT

Hereinafter, preferred embodiments of the present invention will be described in detail with reference to the accompanying drawings.

Figure 1:
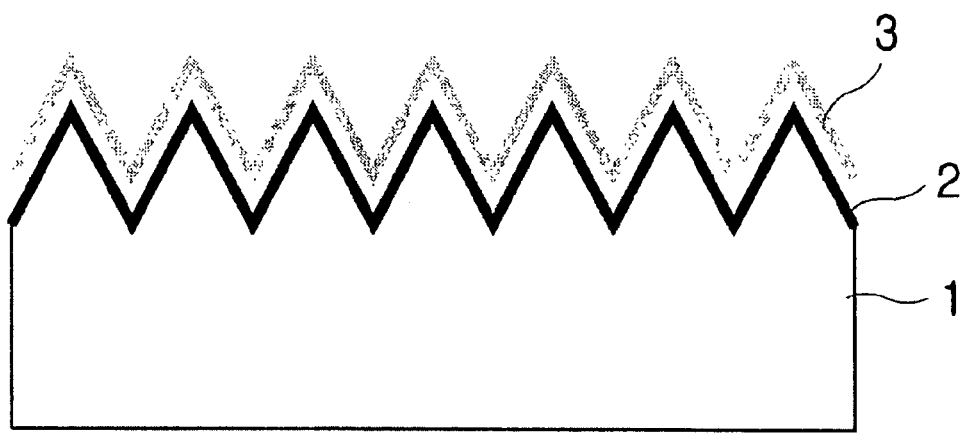
FIG. 1 is an enlarged cross-sectional view of copper foil in accordance with a preferred embodiment of the present invention.
Figure 2:
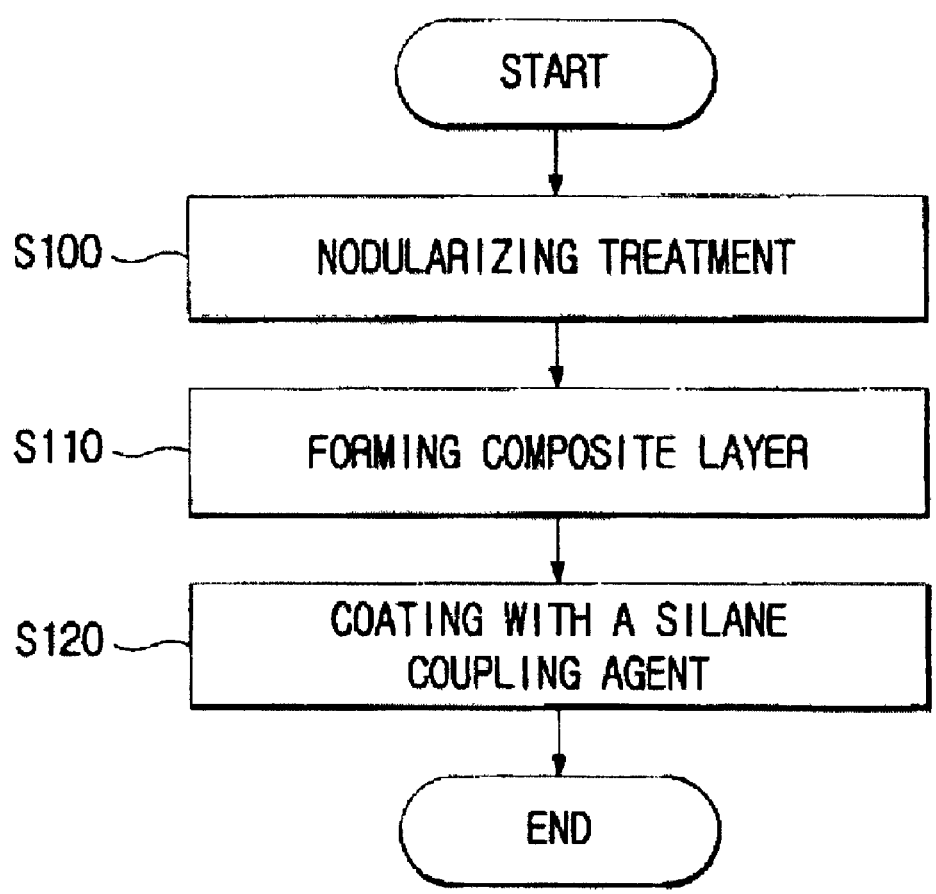
FIG. 2 is a flow sheet of process for carrying out surface treatment of a copper foil in accordance with a preferred process of the present invention.

FIG. 1 is an enlarged cross-sectional view of copper foil in accordance with a preferred embodiment of the present invention and FIG. 2 is a flow sheet of process for carrying out surface treatment of a copper foil in accordance with a preferred method of the present invention.

Referring to FIG. 1 and FIG. 2, first, a surface of copper foil 1 is nodularized (step S100), and then the nodularized surface of copper foil is treated to form a Zn—As composite layer 2 thereon (step S110). Subsequently, the surface-treated copper foil is coated with a silane coupling agent 3. (step S120)

As set forth above, nodularizing a surface of an electrolytic copper foil in the step S100 includes the process of forming nodules on the surface of the electrolytic copper foil whose thickness is 35 μm as generally used so as to improve adhesive strength by increasing a surface area of the copper foil.

In the step S110, the surface of the copper foil is treated with Zn—As electrolyte to form a Zn—As composite layer 2.

At this point, preferable composition of the Zn—As electrolyte is as follows.

| Composition of electrolyte | |
|---|---|
| zinc sulfate (as Zn) | 10 g/l |
| arsenious acid (as As) | 1 g/l |
| pyrophosphoric acid | 120 g/l |

Furthermore, with the composite solution, the surface of copper foil is preferably subjected to surface treatment as follows.

| Treatment condition | |
|---|---|
| solution temperature | 40° C. |
| pH | 11 |
| current density | 10 A/dm$^2$ |
| treatment time | 5 seconds |

The Zn—As composite layer 2 formed through the process as above has an effect on improving surface properties such as stain resistance, heat resistance and chemical resistance.

Moreover, a silane coupling agent 3 used in the step S120 is made by mixing 3-aminopropyltriethoxysilane with vinyltriethoxysilane, which is coated on the surface-treated copper foil and dried.

Low molecular substance corresponding to the alkoxy in the alkylsilane parts must be removed from silane compound in advance for the reaction with inorganic substance. And then, the agent hydrolyzed by water/alcohol is applied on the copper foil by coating process or dipping process to form a layer promoting adhesion between copper foil and prepreg. The organic functional group including silane as above provides chemical bond with another organic substance and physical bond by adsorption to form a strong coupling.

The 3-aminopropyltriethoxysilane can do the condensation reaction by amino group (—NH2) in the heat treatment process and curing process, which promote adhesion at the interface of organic-inorganic substances. Particularly, it decreases the influence of the water on the surface after treatment process.

The vinyltriethoxysilane can do the addition reaction by vinyl group ($CH_2$=CH—) in the heat treatment process and curing process, which contributes to improvement of adhesion which is insufficiently provided only with condensation reaction. As vinyl group has a double coupling, the compounds including vinyl group abound in reactivity and have the property of easily becoming a high molecular substance. Therefore, if the silane coupling agent including the two kinds of silane compound is used, condensation reaction and addition reaction may make a great synergy effect on improving adhesion, hence, a much better adhesion will be provided than not used or only one kind used.

It is preferable that the silane coupling agent is a mixture containing 60~90 wt % of 3-aminopropyltriethoxysilane and 40~10 wt % of vinyltriethoxysilane. If the 3-aminopropyltriethoxy-silane is under 60 wt % in the silane coupling agent, the condensation reaction corresponding to fundamental adhesion reaction can not be shown sufficiently and adhesive strength cannot be obtained as needed. If vinyltriethoxysilane is under 10 wt % in the silane coupling agent, the addition reaction can not be shown sufficiently and the synergy effect is not obtained.

The characteristics of the present invention will be described more clearly as following experiment examples.

EXAMPLE 1

As set forth above, after nodularizing and treating the surface of the copper foil was conducted, coating the surface with a silane coupling agent including 3-aminopropyltriethoxysilane of 4 g/l and vinyltriethoxysilane of 2 g/l was carried out.

COMPARATIVE EXAMPLE 1

The same treatment as the example 1 was carried out, except that coating the surface with only 3-aminopropyltriethoxysilane of 6 g/l was carried out.

COMPARATIVE EXAMPLE 2

The same treatment as the example 1 was carried out, except that coating the surface with only vinyltriethoxysilane of 6 g/l was carried out.

After laminating the electrolytic copper foil and the insulating substrate, peel strength was measured. And then, after treating for 10 hours at 220° C., peel strength under the condition was measured as above. The results are shown in Table 1.

TABLE 1

| | peel strength (kgf/cm) | | |
|---|---|---|---|
| | before heat treatment | after heat treatment | falloff of peel strength after chemical treatment (%) |
| Example 1 | 2.15 | 1.20 | 5 |
| Comparative example 1 | 2.00 | 1.10 | 7 |
| Comparative example 2 | 1.90 | 0.80 | 9 |

The results in Table 1 show that there are 7~9% of peel strength falloff in the comparative examples, whereas there is 5% and less of adhesive strength falloff in the example 1 according to the present invention.

And the results in Table 1 show that the value of peel strength is 1.1~0.8 kgf/cm after heat treatment in the comparative examples, whereas the value of peel strength is 1.2 kgf/cm after heat treatment in the example 1 according to the present invention.

According to the present invention of the surface treatment method of copper foil with a silane coupling agent, as the results in the above table, adhesion to the resins layer is improved relatively after heat treatment process or chemical process as well as at room temperature.

The surface treatment method according to the present invention has been described in detail. However, it should be understood that the detailed description and specific examples, while indicating preferred embodiments of the invention, are given by way of illustration only, since various changes and modifications within the spirit and scope of the invention will become apparent to those skilled in the art from this detailed description.

What is claimed is:

1. A surface treatment method for increasing adhesion of copper foil to an insulating substrate, comprising:

nodularizing a surface of an electrolytic copper foil;

electrolytically treating the surface of the nodularized electrolytic copper foil with a Zn—As electrolyte to form a Zn—As composite layer thereon; and coating the surface of the surface-treated electrolytic copper foil with a silane coupling agent comprising 3-aminopropyltriethoxysilane and vinyltriethoxysilane.

2. The surface treatment method according to claim 1, wherein the silane coupling agent comprises about 60 wt % to about 90 wt % of the 3-aminopropyltriethoxysilane based on the total weight of the silane coupling agent.

3. The surface treatment method according to claim 1, wherein the nodularizing a surface of an electrolytic copper foil includes forming nodules on the surface of the electrolytic copper foil to increase a surface area.

4. The surface treatment method according to claim 1 wherein the Zn—As electrolyte includes zinc sulfate, arsenious acid and pyrophosphoric acid.

5. The surface treatment method according to claim 1, wherein the electrolytically treating the surface of the nodularized electrolytic copper foil is carried out for about 5 seconds at a current density of about 10 A/dm$^2$, a temperature of about 40° C. and a pH of about 11 of the Zn—As electrolyte.

6. The surface treatment method according to claim 1 wherein the silane coupling agent comprises about 40 wt % to about 10 wt % of the vinyltriethoxysilane based on the total weight of the silane coupling agent.

* * * * *